(12) United States Patent
Beckman et al.

(10) Patent No.: US 7,135,750 B1
(45) Date of Patent: Nov. 14, 2006

(54) PHOTODIODE ARRAY HAVING REDUCED DEAD SPACE

(75) Inventors: John C. Beckman, South Hamilton, MA (US); Noel P. Hoilien, Saint Paul, MN (US)

(73) Assignee: Polar Semiconductor, Inc., Bloomington, MN (US)

( * ) Notice: Subject to any disclaimer, the term of this patent is extended or adjusted under 35 U.S.C. 154(b) by 177 days.

(21) Appl. No.: 10/859,262

(22) Filed: Jun. 2, 2004

(51) Int. Cl.
*H01L 31/00* (2006.01)

(52) U.S. Cl. ............... 257/443; 257/448; 257/457; 257/459; 257/E31.115; 257/E27.133

(58) Field of Classification Search ......... 257/437, 257/443, 459, 462, E31.115, E27.133, 233, 257/448, 457
See application file for complete search history.

(56) References Cited

U.S. PATENT DOCUMENTS 5,204,520 A * 4/1993 Green ............ 250/214.1
6,864,475 B1 * 3/2005 Aita et al. ............ 250/208.1
2006/0132633 A1 * 6/2006 Nam et al. ............ 348/308

\* cited by examiner

*Primary Examiner*—N. Drew Richards
*Assistant Examiner*—José R. Díaz
(74) *Attorney, Agent, or Firm*—Kinney & Lange, PA

(57) ABSTRACT

A photodiode array includes a first photodiode and at least a second photodiode. The first photodiode includes a first active area, a first anti-reflective coating area, and a first residual polysilicon ring. The first anti-reflective coating area and the first residual polysilicon ring are formed asymmetrically over the first active area. The second photodiode includes a second active area, a second anti-reflective coating area, and a second residual polysilicon ring. The second anti-reflective coating area and the second residual polysilicon ring are formed asymmetrically over the second active area. The first anti-reflective coating area is formed over a region of the first active region adjacent to the second photodiode, and the second anti-reflective coating area is formed over a region of the second active region adjacent to the first photodiode.

12 Claims, 2 Drawing Sheets

US 7,135,750 B1

PHOTODIODE ARRAY HAVING REDUCED DEAD SPACE

BACKGROUND OF THE INVENTION

The present invention relates to the use of photodiode devices arranged in an array, and more particularly to a configuration of photodiode devices that reduces the "dead space" between devices in the array.

Photodiode arrays are used to detect light signals incident to the photodiode surfaces. Light signals incident to the photodiode surfaces will generate electrical signals that are representative of the light signals. Thus, photodiodes are popular in applications that use light signals to carry and retrieve information, like compact disc players and DVD players. Typically, these applications employ a number of photodiode devices arranged in an array. The use of a photodiode array allows the application to compare incoming light signal strengths at adjacent photodiodes, which allows adjustment of aspects such as the tracking or focus of the system.

To prevent electrical coupling between adjacent photodiodes, which adversely affects photodiode array performance, adjacent photodiodes must be spaced a certain minimum distance apart. The spacing between adjacent photodiodes in the photodiode array creates regions in which incident light is not detected, often referred to as dead space. One of the goals of photodiode array designers is to minimize the dead regions between adjacent photodiodes in an array, allowing for better operation of the devices. The present invention allows for minimization of dead space between photodiodes placed in an array of photodiodes.

BRIEF SUMMARY OF THE INVENTION

The present invention describes a photodiode array made up of a number of individual photodiodes. Each photodiode includes an active region, an anti-reflective coating, a number of anode contacts, and a number of cathode contacts. The anti-reflective coating is formed asymmetrically over the portion of the active region closest to an adjacent photodiode. The anode contacts and cathode contacts are placed around the active region of each photodiode, except in the areas between active areas of adjacent photodiodes.

DETAILED DESCRIPTION

Figure 1:
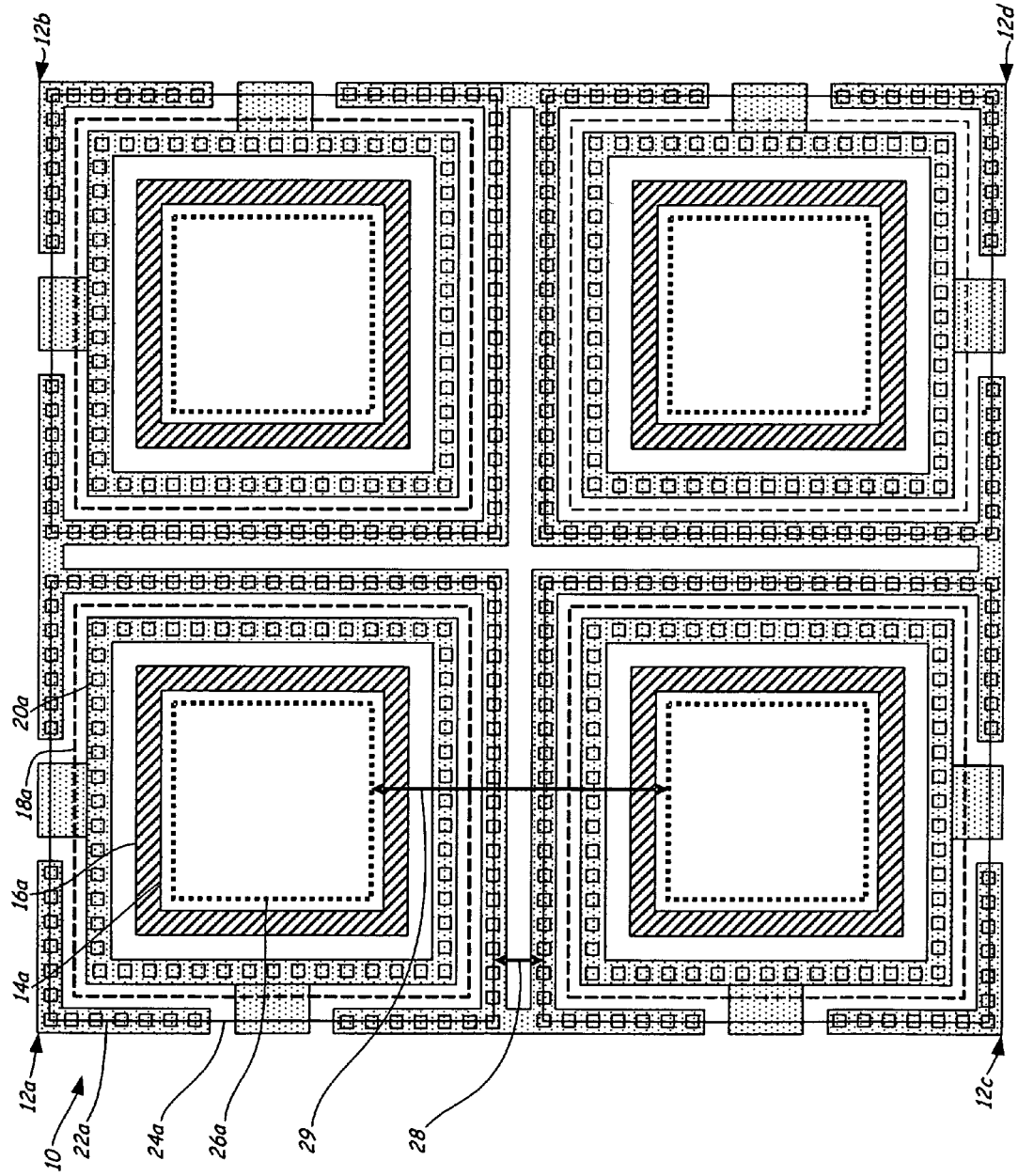
FIG. 1 is a layout diagram of a photodiode array as known in the prior art.

FIG. 1 shows a typical semiconductor layout of photodiode array 10, as known in the prior art. Photodiode array 10 is made up of four individual photodiodes 12a, 12b, 12c, and 12d. Because each individual photodiode 12a, 12b, 12c, and 12d operates in much the same manner, they will be referred to generally as photodiodes 12. Photodiodes 12 include anti-reflective coating ("ARC") regions 14a, 14b, 14c, and 14d (collectively "14"), residual polysilicon rings 16a, 16b, 16c, and 16d (collectively "16"), active regions 18a, 18b, 18c, and 18d (collectively "18"), a number of cathode contacts 20a, 20b, 20c, and 20d (collectively "20"), a number of anode contacts 22a, 22b, 22c, and 22d (collectively "22"), and a number of NTUB regions 24a, 24b, 24c, and 24d (collectively "24").

Photodiodes 12 operate to detect incoming light signals, and in response to these light signals generate electrical signals. Active region 18 is responsible for detecting the incoming light. To ensure that active region 18 is presented with the maximum amount of incident light, ARC 14 is formed over the top of at least portions of active region 18. ARC 14 prevents a portion of the incoming light signal from being reflected away from active region 18, thus maximizing the incident light signal available to active region 18. A by-product of the manufacturing process used in forming ARC 14 over the top of active region 18 is the creation of residual polysilicon ring 16. For practical purposes, the area of active region 18 covered by ARC 14 is responsible for detecting most of the incoming light signals, and thus the area of active region 18 with ARC 14 placed on top is referred to as photosensitive region 26. The electrical signal generated by the incoming light signal is created between cathode contacts 20 and anode contacts 22. Cathode contacts 20 are located just inside the active region 18, and are shown surrounding ARC 14. Anode contacts 22 are located outside of cathode contacts 20. As shown in FIG. 1, a number of cathode contacts 20 and anode contacts 22 surround ARC 14 of each photodiode 12. A large number of cathode contacts 20 and anode contacts 22 are placed around each photodiode 12 to reduce the overall resistance of photodiode 12.

One benefit of using photodiode array 10 in a particular application is that the application can compare the amount of light reaching adjacent individual photodiodes 12a, 12b, 12c, and 12d, which allows the application to extract information that would not be possible with a single photodiode. As discussed above, in applications that use photodiode array 10, minimizing the distance between photosensitive regions 26 (ARC 14 formed over active region 18) is very desirable. However, placing the individual photodiodes 12 too close to adjacent photodiodes could result in an electrical short between the two devices. To ensure photodiodes 12 are not shorted to one another, manufacturers use design rules to determine the minimum amount of distance allowed between individual photodiodes 12. An example of such a design rule is shown in FIG. 1, as minimum NTUB space 28. NTUB 24 is a region of n-type material used as a cathode for each photodiode 12. Minimum NTUB space 28 represents the closest the manufacturer can place adjacent NTUB regions 24 of photodiodes 12 while ensuring that adjacent photodiodes 12 do not short circuit. In the embodiment shown in FIG. 1, minimum NTUB space 28 is 1.85 um, although this is shown for purposes of example and may vary according to device application and manufacturer. Once the minimum NTUB space 28 is established, the remainder of photodiode 12 is constructed according to proper design rules. In the prior art example shown in FIG. 1, each photodiode 12 is created symmetrically within the area defined by NTUB 24. For example, photodiode 12a is constructed by placing a number of cathode contacts 20a symmetrically around the perimeter of photodiode 12a, placing a number of anode contacts 22a symmetrically around photodiode 12a, creating active region 18a in the middle of cathode contacts 20a and anode contacts 22a, and finally forming ARC 14a symmetrically over active region 18a, according to the proper design rules. The same process is carried out for the other three photodiodes 12b, 12c, and 12d, ensuring the minimum NTUB space 28 exists between each photodiode 12. The result is a photodiode array 10, in which the minimum distance 29 between adjacent photosensitive regions 26 is 10.35 μm (in the example shown in FIG. 1). This distance 29 between adjacent photosensitive regions 26 covered with ARC 14 is known as dead space, because any light signal incident on this region is lost. Therefore, it is desirable to decrease the distance between adjacent photosensitive regions.

Figure 2:
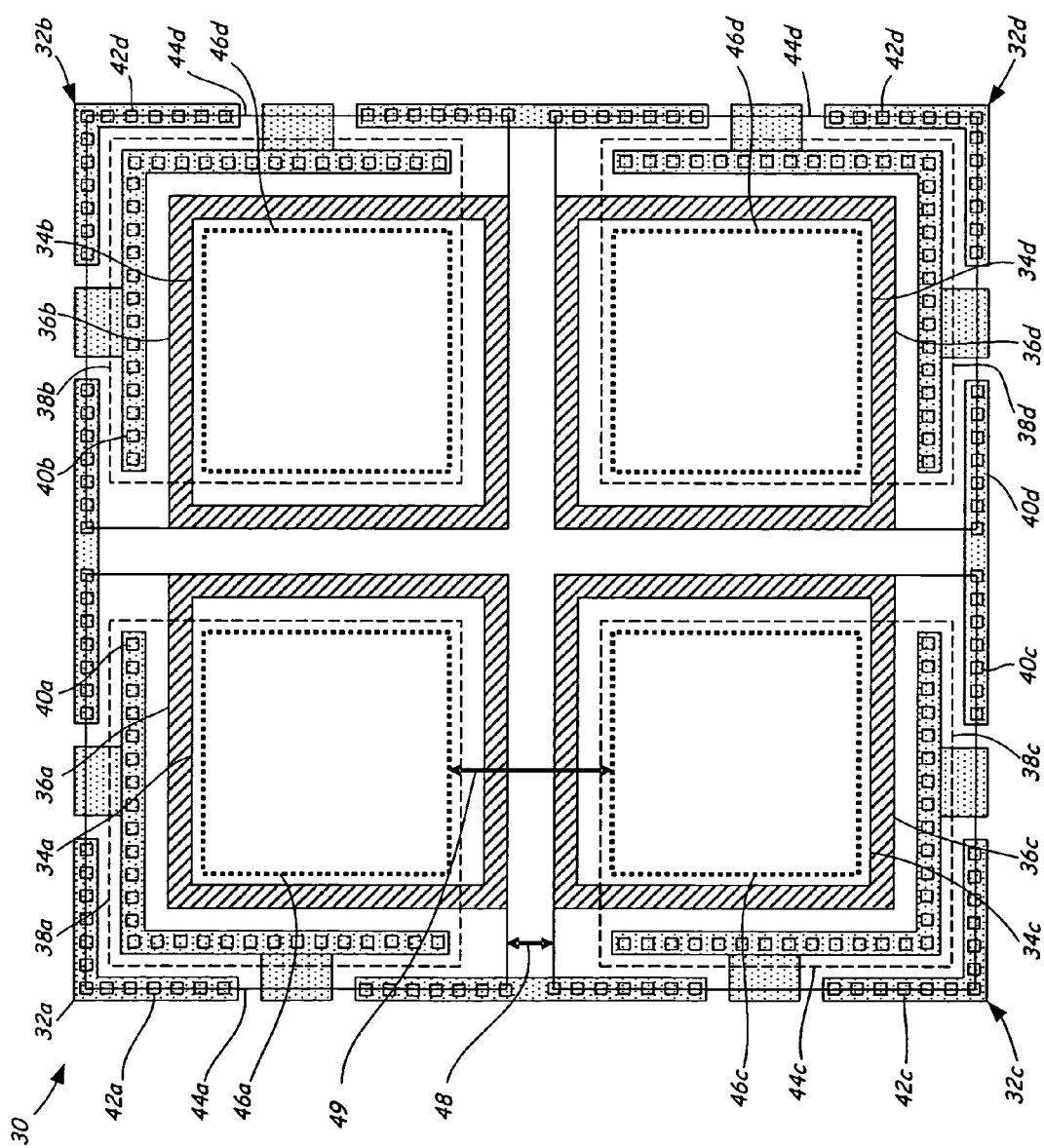
FIG. 2 is a layout diagram of an exemplary photodiode array layout according to an embodiment of the present invention.

FIG. 2 illustrates a layout design of photodiode array 30 according to an embodiment of the present invention. The exemplary embodiment shown in FIG. 2 improves upon the prior art embodiment shown in FIG. 1 by including a number of features which decrease the dead space between adjacent photosensitive regions.

As shown in FIG. 2, photodiode array 30 includes four individual photodiodes 32a, 32b, 32c and 32d (collectively "32"). Each photodiode includes anti-reflective coating 34a, 34b, 34c and 34d (collectively "34"), residual poly ring 36a, 36b, 36c and 36d (collectively "36"), active region 38a, 38b, 38c and 38d (collectively "38"), a number of cathode contacts 40a, 40b, 40c and 40d (collectively "40"), a number of anode contacts 42a, 42b, 42c and 42d (collectively "42"), and a number of NTUB regions 44a, 44b, 44c, and 44d (collectively "44").

Photodiodes 32 operate as discussed above with respect to FIG. 1, operating to detect incoming light signals, and in response to these light signals generate electrical signals. Active region 38 is responsible for detecting the incoming light. ARC 34 is formed over the top of at least some portions of active region 38. ARC 34 prevents a portion of the incoming light signal from being reflected away from active region 38, thus maximizing the incident light signal available to active region 38. In the exemplary embodiment shown, a by-product of using ARC 34 over active region 38 is the creation of residual polysilicon ring 36. For practical purposes, the area of active region 38 covered by ARC 34 is responsible for detecting most of the incoming light signals, and thus the area of active region 38 with ARC 34 formed on top is referred to as photosensitive region 46. The electrical signal generated by photodiodes 30 in response to the incoming light signal is created between cathode contacts 40 and anode contacts 42. Cathode contacts 40 are located just inside the active region 38, partially surrounding the ARC 34 and the residual polysilicon ring 36. Anode contacts 42 are located outside of cathode contacts 40. Each photodiode 32 includes a number of cathode contacts 40 and anode contacts 42 placed partially around ARC 34. Each photodiode 32 also includes NTUB region 44, which forms the cathode of each photodiode 32.

As discussed above with respect to FIG. 1, one benefit of using photodiode array 30 in a particular application is that the application can compare the amount of light reaching adjacent individual photodiodes 32a, 32b, 32c, and 32d, which allows the application to extract information that would not be possible with a single photodiode. As discussed above, in applications that use photodiode array 30, minimizing the distance between photosensitive regions 46 (ARC 34 formed over active region 38) is very desirable. However, placing the individual photodiodes 32 too close to adjacent photodiodes could result in an electrical short between the two devices. To ensure photodiodes 32 are not shorted to one another, manufacturers use design rules to determine the minimum amount of distance allowed between individual photodiodes 32. An example of such a design rule is shown in FIG. 2 as minimum NTUB space 48. NTUB 44 is a region of n-type material used as a cathode for each photodiode 32. Minimum NTUB space 48 represents the closest distance the manufacturer can place individual NTUB regions 44 to adjacent photodiodes 32 while ensuring that photodiodes 32 do not short circuit together. In the embodiment shown in FIG. 2, minimum NTUB space 48 is 1.85 μm, although this is shown for purposes of example and may vary according to device application and manufacturer. Notice that the minimum NTUB space shown in the prior art example of FIG. 1 is the same as the minimum NTUB space 48 of the exemplary embodiment of the present invention shown in FIG. 2. The minimum NTUB space 48 ensures adjacent photodiodes 32 are not shorted together, and therefore is the same for both arrays.

Photodiode array 30 minimizes the dead space between adjacent photodiodes by utilizing several features. In the exemplary embodiment shown in FIG. 2, cathode contacts 40 are placed only partially around ARC 34 instead of fully enclosing the ARC as shown in FIG. 1. No cathode contacts 40 are formed between adjacent photodiodes 32. Similarly, anode contacts 42 are placed only partially enclosing active area 38 and cathode contacts 40. Again, no anode contacts 42 are formed between adjacent photodiodes 32. For example, photodiode 32a is adjacent to photodiode 32c. In the space in between photodiodes 32a and 32c, there are no cathode contacts 40a or anode contacts 42a on the side of photodiode 32a adjacent to photodiode 32c. Likewise, there are no cathode contacts 40c or anode contacts 42c on the side of photodiode 32c adjacent to photodiode 32a. By removing cathode contacts 40a and 42c and anode contacts 42a and 42c that were previously located between adjacent photodiodes 32a and 32c, active regions 38a and 38c can be formed closer together. Similarly, cathode contacts 40a and 40b and anode contacts 42a and 42b are removed from the space between photodiodes 32a and photodiode 32b, and also for the spaces between the other photodiodes of photodiode array 30. A side-effect of limiting the placement of cathode contacts 40a and anode contacts 42a is an increase in resistance of photodiode 32a.

Removing cathode contacts 40 and anode contacts 42 from the sides of photodiodes 32 adjacent to one another does not alter the design rule requirement that minimum NTUB space 48 remain the same. Rather, it rearranges the layout of each individual photodiode 32 such that cathode contacts 40 and anode contacts 42 that formerly were located in the dead space between adjacent photodiodes 32 have been removed, allowing adjacent photosensitive regions 46 to be formed closer together.

Another feature of the exemplary embodiment shown in FIG. 2 provides for ARC 34 and residual polysilicon ring 36 being formed asymmetrically over active region 38 within photodiode 32. To illustrate, the formation of photodiode 32a located in the upper left corner of FIG. 2 and the formation of photodiode 32c located in the lower left corner of FIG. 2 are reviewed. The new asymmetrical placements of ARC 34a and ARC 34c will be compared to the locations of ARC 14a and ARC 14c in the prior art embodiment shown in FIG. 1 for reference and ease of understanding. ARC 34a of photodiode 32a is shifted horizontally (to the right in FIG. 2) toward photodiode 12b and vertically (down in FIG. 2) toward photodiode 12c, so that it extends outside of active region 38a. Shifting ARC 34a requires shifting of residual polysilicon ring 36a as well, resulting in residual poly ring 36a being shifted horizontally toward photodiode 12b and vertically toward photodiode 12c, also extending outside of active region 38a. Similarly, photodiode 32c located in the lower left corner of FIG. 2 has ARC 34c and residual polysilicon ring 36c shifted toward adjacent photodiodes 32a and 32d. ARC 34c is shifted horizontally (to the right in FIG. 2) toward photodiode 12d and vertically (up in FIG. 2) toward photodiode 12a, so that it extends outside of active region 38c. Shifting ARC 34c requires shifting of residual polysilicon ring 36c as well, resulting in residual polysilicon ring 36c being shifted horizontally toward photodiode 12d and vertically toward photodiode 12a, also extending outside of active region 38c.

The resulting photosensitive regions 46a and 46c are defined by the forming of ARCs 34a and 34c, respectively, over active regions 38a and 38c, respectively. By shifting ARC 34a and residual polysilicon ring 36a, photosensitive region 46a is created at the edges of active region 38a adjacent to nearby photodiodes 32b and 32c. Likewise, by shifting ARC 34c and residual polysilicon ring 36c, photosensitive region 46c is created at the edges of active region 38c adjacent to nearby photodiodes 32a and 32d. The dead space between adjacent photodiodes 32a and 32c is shown by arrow 49 in FIG. 2. In this case, the distance between photosensitive region 46a and 46c is 4.85 µm. This is due both to the removal of cathode contacts 40a and 40c and anode contacts 42a and 42c located between photodiodes 32a and 32c, and to the asymmetrical placement of ARCs 34a and 34c over the respective portions of active regions 38a and 38c. The result is a minimization of the distance between photosensitive region 46a and photosensitive region 46c.

Analogous to the discussion above, photodiode 32b located in the upper right corner of FIG. 2 has ARC 34b and residual polysilicon ring 36b shifted toward adjacent photodiodes 32a and 32d. ARC 34b is shifted horizontally toward photodiode 12a and vertically toward photodiode 12d, so that it extends outside of active region 38b. Shifting ARC 34b requires shifting of residual polysilicon ring 36b as well, resulting in residual polysilicon ring 36b being shifted horizontally toward photodiode 12a and vertically toward photodiode 12d, also extending outside of active region 38b. By shifting ARC 34b and residual polysilicon ring 36b, photosensitive region 46b is created at the edges of active region 38b adjacent to nearby photodiodes 32a and 32d. The resulting dead space between photodiode 32a and photodiode 32b has also been reduced to 4.85 µm. This is due in part to the removal of anode contacts 42a and 42b and cathode contacts 40a and 40b located between photodiodes 32a and 32b, respectively, as well as the asymmetrical placement of ARC 34a and ARC 34b over the portion of active region 38a and 38b.

Similar shifting of ARC 34d and residual polysilicon ring 36d occurs over photodiode 32d. Photodiode 32d located in the lower right corner of FIG. 2 has ARC 34d and residual polysilicon ring 36d shifted toward adjacent photodiodes 32b and 32c. ARC 34d is shifted horizontally toward photodiode 12c and vertically toward photodiode 12b, so that it extends outside of active region 38d. Shifting ARC 34d requires shifting of residual polysilicon ring 36d as well, resulting in residual polysilicon ring 36d being shifted horizontally toward photodiode 12c and vertically toward photodiode 12b, also extending outside of active region 38d. By shifting ARC 34d and residual polysilicon ring 36d, photosensitive region 46d is created at the edges of active region 38d adjacent to nearby photodiodes 32b and 32c.

The combination of both of these exemplary features is shown in FIG. 2, including the removal of cathode contacts 40 and anode contacts 42 from the sides of adjacent photodiodes 32, as well as the asymmetrical placement of ARC 34 and residual polysilicon ring 36. The same design rules applied to photodiode array 10 shown in FIG. 1 apply, including a minimum NTUB space of 1.85 µm. By removing cathode contacts 40 and anode contacts 42 from the sides of adjacent photodiodes 32, as well as asymmetrically placing ARC 34 and residual polysilicon ring 36, the dead space 49 between adjacent photosensitive regions 46 can be reduced from 10.35 µm to 4.85 µm. It should be understood that these values are shown for example and for purposes of comparison with photodiode array 10 shown in FIG. 1, to explain the advantages of the exemplary embodiment of photodiode array 30 shown in FIG. 2.

Although the present invention has been described with reference to preferred embodiments, workers skilled in the art will recognize that changes may be made in form and detail without departing from the spirit and scope of the invention.

The invention claimed is:

1. A photodiode array comprising:
   a first photodiode comprising:
      a first active area;
      a first anti-reflective coating area; and
      a first residual polysilicon ring area, wherein the first anti-reflective coating area and the first residual polysilicon ring area are formed asymmetrically over the first active area; and
   at least a second photodiode adjacent to the first photodiode comprising:
      a second active area;
      a second anti-reflective coating area; and
      a second residual polysilicon ring area, wherein the second anti-reflective coating area and the second residual polysilicon ring area are formed asymmetrically over the second active area;
   wherein the first anti-reflective coating area is formed over a region of the first active region adjacent to the second photodiode, and the second anti-reflective coating area is formed over a region of the second active region adjacent to the first photodiode.

2. The photodiode array of claim 1, wherein a portion of the first anti-reflective coating area extends outside of the first active area.

3. The photodiode array of claim 1, wherein a portion of the second anti-reflective coating area extends outside of the second active area.

4. The photodiode array of claim 1, further including:
   a first n-type well forming a cathode of the first photodiode; and
   a second n-type well forming a cathode of the second photodiode, the second n-type well being located at least a predetermined distance from the first n-type well.

5. The photodiode array of claim 4, wherein the first active region is formed on the first n-type well and the second active region is formed on the second n-type well.

6. The photodiode array of claim 1, further including:
   a first set of cathode contacts located partially surrounding the first anti-reflective coating area; and
   a second set of cathode contacts located partially surrounding the second anti-reflective coating area, wherein the first set of cathode contacts and the second set of cathode contacts are not placed in a region between the first anti-reflective coating area and the second anti-reflective coating area.

7. The photodiode array of claim 1, further including:
   a first set of anode contacts located partially surrounding the first active region; and
   a second set of anode contacts located partially surrounding the second active region, wherein the first set of anode contacts and the second set of anode contacts are not placed in a region between the first active region and the second active region.

8. A photodiode array comprising:
  a first photodiode comprising:
    a first photosensitive area;
    a plurality of first cathode contacts partially surrounding the first photosensitive area; and
    a plurality of first anode contacts partially surrounding the first photosensitive area; and
  at least a second photodiode formed adjacent to the first photodiode, comprising:
    a second photosensitive area;
    a plurality of second cathode contacts partially surrounding the second photosensitive area; and
    a plurality of second anode contacts partially surrounding the second photosensitive area;
  wherein the first cathode contacts and the first anode contacts are formed only in areas not located between the first photodiode and the second photodiode, and wherein the second cathode contacts and the second anode contacts are formed only in areas not located between the first photosensitive area and the second photosensitive area.

9. The photodiode array of claim 8, further comprising:
  a third photodiode formed adjacent to the first photodiode, comprising:
    a third photosensitive area;
    a plurality of third cathode contacts partially surrounding the third photosensitive area; and
    a plurality of third anode contacts partially surrounding the third photosensitive area; and
  a fourth photodiode formed adjacent to the second photodiode and the third photodiode, comprising:
    a fourth photosensitive area;
    a plurality of fourth cathode contacts partially surrounding the fourth photosensitive area; and
    a plurality of fourth anode contacts partially surrounding the fourth photosensitive area;
  wherein:
    the first cathode contacts and the first anode contacts are formed only in areas not located between the first photosensitive area and the second photosensitive area and not located between the first photosensitive area and the third photosensitive area;
    the second cathode contacts and the second anode contacts are formed only in areas not located between the first photosensitive area and the second photosensitive area and not located between the second photosensitive area and the fourth photosensitive area;
    the third cathode contacts and the third anode contacts are formed only in areas not located between the first photosensitive area and the third photosensitive area and not located between the third photosensitive area and the fourth photosensitive area; and
    the fourth cathode contacts and the fourth anode contacts are formed only in areas not located between the second photosensitive area and the fourth photosensitive area and not located between the third photosensitive area and the fourth photosensitive area.

10. The photodiode array of claim 9, wherein the first, second, third and fourth photosensitive areas each includes a number of sides non-adjacent to other photodiodes and a number of sides adjacent to other photodiodes, and wherein the first, second, third and fourth cathode contacts and the first, second, third and fourth anode contacts are formed partially surrounding the first, second, third and fourth photosensitive areas, respectively, on the number of sides non-adjacent to other photodiodes.

11. The photodiode of claim 8, further including:
  a first active region; and
  a first anti-reflective coating, wherein the first anti-reflective coating is formed asymmetrically over a region of the first active region adjacent to the second photodiode to create the first photosensitive area.

12. The photodiode of claim 8, further including:
  a second active region; and
  a second anti-reflective coating, wherein the second anti-reflective coating is formed asymmetrically over a region of the second active region adjacent to the first photodiode to create the second photosensitive area.

* * * * *